(12) United States Patent
Tao et al.

(10) Patent No.: US 6,768,207 B2
(45) Date of Patent: Jul. 27, 2004

(54) MULTICHIP WAFER-LEVEL PACKAGE AND METHOD FOR MANUFACTURING THE SAME

(75) Inventors: Su Tao, Kaohsiung (TW); Kuo Chung Yee, Taipei (TW); Jen Chieh Kao, Kaohsiung (TW); Chih Lung Chen, Fengshan (TW); Hsing Jung Liau, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/392,851

(22) Filed: Mar. 21, 2003

(65) Prior Publication Data

US 2003/0214029 A1 Nov. 20, 2003

(30) Foreign Application Priority Data

May 17, 2002 (TW) ...................................... 91110827 A

(51) Int. Cl.[7] .............................................. H01L 23/48
(52) U.S. Cl. .................. 257/777; 257/723; 257/781; 257/784; 257/786
(58) Field of Search ................................ 257/777, 723, 257/781, 784, 786

(56) References Cited

U.S. PATENT DOCUMENTS

| | | | |
|---|---|---|---|
| 5,726,500 A | * 3/1998 | Duboz et al. | ................ 257/777 |
| 5,734,199 A | * 3/1998 | Kawakita et al. | ............ 257/737 |
| 5,898,223 A | * 4/1999 | Frye et al. | ................... 257/777 |
| 5,973,403 A | 10/1999 | Wark | |
| 2002/0093096 A1 | * 7/2002 | Tago et al. | ................. 257/738 |
| 2003/0057559 A1 | * 3/2003 | Mis et al. | .................... 257/762 |

FOREIGN PATENT DOCUMENTS

JP 3-231450 * 10/1991 ................. 257/777

OTHER PUBLICATIONS

US patent application Ser. No. 09/928,694.

* cited by examiner

*Primary Examiner*—Jasmine Clark

(57) ABSTRACT

A multichip wafer-level package includes a first chip, a second chip, a bump ring and a plurality of bumps. The first chip has a semiconductor device, a first bonding ring surrounding the semiconductor device, a plurality of internal bonding pads disposed within the first bonding ring and electrically connected to the semiconductor device, and a plurality of external bonding pads disposed outside the first bonding ring and electrically connected to the semiconductor device for electrically connecting to an external circuit. The second chip has an electronic device, a plurality of bonding pads electrically connected to the electronic device and corresponding to the internal bonding pads of the first chip, and a second bonding ring corresponding to the first bonding ring of the first chip. The bump ring is disposed between the first bonding ring of the first chip and the second bonding ring of the second chip for bonding the first and the second chips so as to form a cavity for accommodating the semiconductor device. The bumps electrically connect the internal bonding pads of the first chip to the bonding pads of the second chip.

11 Claims, 11 Drawing Sheets

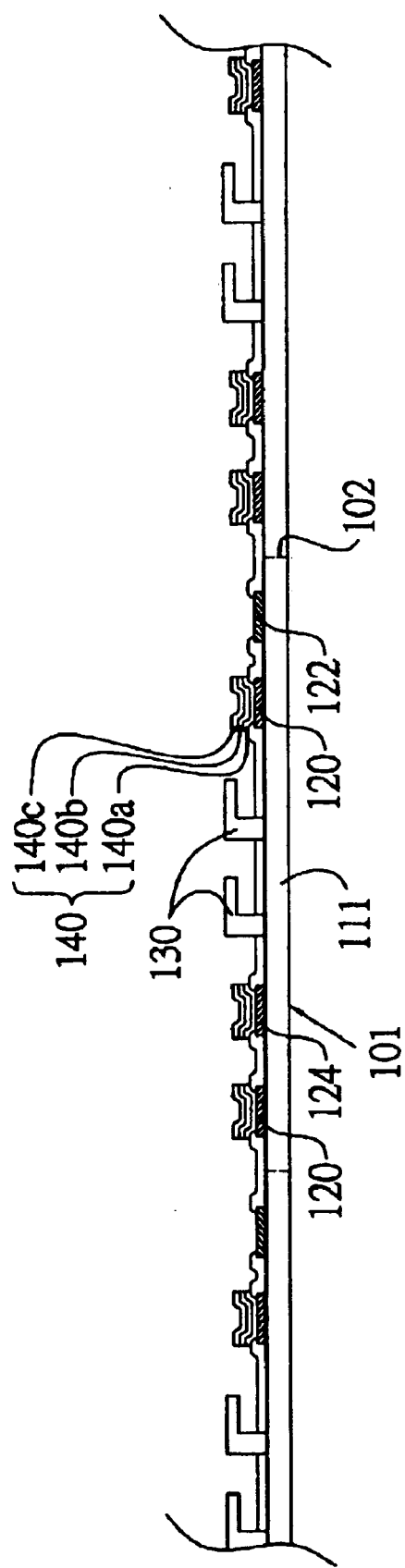

MULTICHIP WAFER-LEVEL PACKAGE AND METHOD FOR MANUFACTURING THE SAME

BACKGROUND OF THE INVENTION

1. Field of the Invention

The present invention generally relates to a method for manufacturing a semiconductor package, and more particularly to a method for manufacturing a multi-chip module (MCM) package.

2. Description of the Related Art

Due to the configuration of electronic products becoming more and more light and compact, packages protecting semiconductor chips and connecting external circuits are required in a light and compact size.

An electrical package structure generally comprises at least one active device disposed on one circuit substrate. The active device is generally a chip cut from a wafer (made of silicon, germanium arsenide, gallium arsenide). A package comprising one device is generally referred to as a single-chip module (SCM) package, and a package comprising a plurality of devices is generally referred to as a multi-chip module (MCM) package.

With the increasing requirement of minimization and high operating speed for electronic devices, the MCM package, therefore, is becoming more and more popular. The MCM package can combine two or more than two chips together into a single package so as to reduce the limitation of the operating speed of an electronic device. In addition, the MCM package can shorten the connected length between chips so as to reduce signal delay and access time of the electronic device.

FIG. 1 shows a side-by-side MCM package, a conventional MCM package, in which more than two chips 10', 11', and 12' are mounted side by side to a main mounting surface of a common substrate 14. The connections of wirings (not shown) between the chip and the common substrate are generally completed by wire bonding method. The advantage of such package is that wafers 10, 11, and 12, respectively having high-density devices or chips 10', 11', and 12', are produced with their respective manufacturing processes incompatible to one other; then the devices or chips 10', 11', and 12' are integrated into the common substrate 14 with an arrangement of low-density manner. However, such side-by-side MCM package still has some disadvantages. First, the package efficiency is relatively low since the area of the common substrate needs to increase as the number of chips increase. Secondly, the packaging process of the chips proceeds after the wafer-dicing process and the chip-arranging process, therefore the chips is easily contaminated when compared to a wafer-level package technique.

Therefore, the semiconductor packaging industry has developed chip-stack package. U.S. Pat. No. 5,973,403 discloses a multichip stacked device for stacking a wire-bonded chip on a flip-chip bonded chip as shown in FIG. 2 and FIG. 3. The multichip stacked device comprises a semiconductor chip 25 disposed on a substrate 20 by a flip-chip bonding method, and a second semiconductor chip 26 stacked on the first semiconductor chip 25 and electrically connected to the substrate 20 by a wire-bonding method. The substrate 20 has a plurality of wire-bonding pads 22 and a plurality of flip-chip bonding pads 24 disposed thereon.

The first semiconductor chip 25 is bonded to flip-chip bonding pads 24 of the substrate 20 with solder joints while the second semiconductor chip 26 is connected to the wire-bonding pads 22 of the substrate 20 with a plurality of wires. The lower chip 25 is not impeded by the upper chip 26 due to its electrical connection to the substrate 20 by the flip-chip bonding method.

However, the circuit layout of the substrate will be relatively complicated, and the density and length of wires on the substrate will also be greatly increased. Due to the increased length of the wires, the impedance, inductance, and noise accordingly increase to affect the electrical efficiency at the final package. The increased inductance also causes the semiconductor package to consume more power and causes the integrated circuit and the wires inside the chips to easily meet power surges. In addition, due to the increased length of the wires, the wires may break easily during the wire-bonding process and cause the wire sweep during the encapsulation process. The chip-stacked package is a chip-to-substrate package, that is, the packaging process proceeds after chips are cut from the wafers such that the surfaces of the chips may be contaminated during the wafer-dicing process.

Further, the chip-stacked package employs the flip-chip method for electrically connecting the chip to the substrate, that is, solder bumps are formed on the bonding pads of the IC chip, and the IC chip is disposed on the substrate and complete the alignment of the bonding pads such that the solder balls are formed and the IC chip connects to the substrate through heat reflow process cooperating with the surface tension effect of the solder fusion. The flip-chip bonding method has the thermal mismatch problem and is a high-temperature process such that the flip-chip bonding method is not applicable for semiconductor chips which are not high temperature-resistant.

Therefore, it is needed to provide a method of manufacturing a multichip wafer-level package so as to solve the above-mentioned problems in the prior art.

SUMMARY OF THE INVENTION

It is an object of the present invention to provide a multichip package, which can complete the packaging process and electrical connection between chips in a wafer-level packaging.

It is another object of the present invention to provide a multichip package with a hermetical cavity which surrounds a semiconductor micro device so as to ensure the reliability of the semiconductor micro device.

In order to achieve the objects mentioned hereinabove, the present invention provides a wafer-level multichip package, which comprises a first chip, a second chip, a bump ring and a plurality of bumps. The first chip has a semiconductor device, a first bonding ring surrounding the semiconductor device, a plurality of internal bonding pads disposed within the first bonding ring, and a plurality of external bonding pads disposed outside the first bonding ring and electrically connected to the semiconductor device for electrically connecting to an external circuit. The second chip has an electronic device, a plurality of bonding pads electrically connected to the electronic device and corresponding to the internal bonding pads of the first chip, and a second bonding ring corresponding to the first bonding ring of the first chip. The bump ring is disposed between the first bonding ring of the first chip and the second bonding ring of the second chip for bonding the first and the second chips so as to form a cavity for accommodating the semiconductor device. The bumps electrically connect the internal bonding pads of the first chip to the bonding pads of the second chip.

The present invention further provides a method for manufacturing a multichip wafer-level package with a hermetical cavity, which comprises the following steps: providing a first wafer comprising a plurality of first chips wherein each first chip is spaced to one another by scribe lines and each chip has a semiconductor device, a bonding ring, a plurality of internal bonding pads disposed within the bonding ring and electrically connected to the semiconductor device, and a plurality of external bonding pads disposed outside the first bonding ring and electrically connected to the semiconductor device for electrically connecting to an external circuit; providing a second wafer comprising a plurality of second chips wherein each second chip is spaced to one another by scribe lines and each chip has a plurality of electronic device, a plurality of bonding pads electrically connected to the electronic devices and corresponding to the internal bonding pads of the first chip, and a second bonding ring corresponding to the first bonding ring of the first chip; forming a adhesion ring on the bonding ring of the first chip or the bonding ring of the second chip; forming conductive bumps on the internal bonding pads of the first chip or bonding pads of the second chip; aligning the first wafer with the second wafer and then bonding them together such that the adhesion ring connects the bonding ring of the first chip and the bonding ring of the second chip so as to form a hermetical cavity between the first chip and the second chip and such that the conductive bumps electrically connect the internal bonding pads of the first chip and the bonding pads of the second chip; and cutting the first wafer and the second wafer along the scribe lines of the first wafer and the second wafer respectively so as to form packages individually.

According to the multichip wafer-level package with a hermetical cavity of the present invention, two wafers can be bonded by bumps in vacuum with a temperature below 150° C., namely cold welding process, so as to be applicable for a packaging process having various type of semiconductor micro devices (or chips). Further, the present invention provides a metal (gold) material, instead of the conventional outgasing material (i.e. epoxy), as an intermediated layer for forming a hermetical cavity between these two wafers, so as to ensure the reliability of the semiconductor micro devices and the chips.

BRIEF DESCRIPTION OF THE DRAWINGS

Other objects, advantages, and novel features of the invention will become more apparent from the following detailed description when taken in conjunction with the accompanying drawings.

DESCRIPTION OF THE PREFERRED EMBODIMENT

Figure 1:
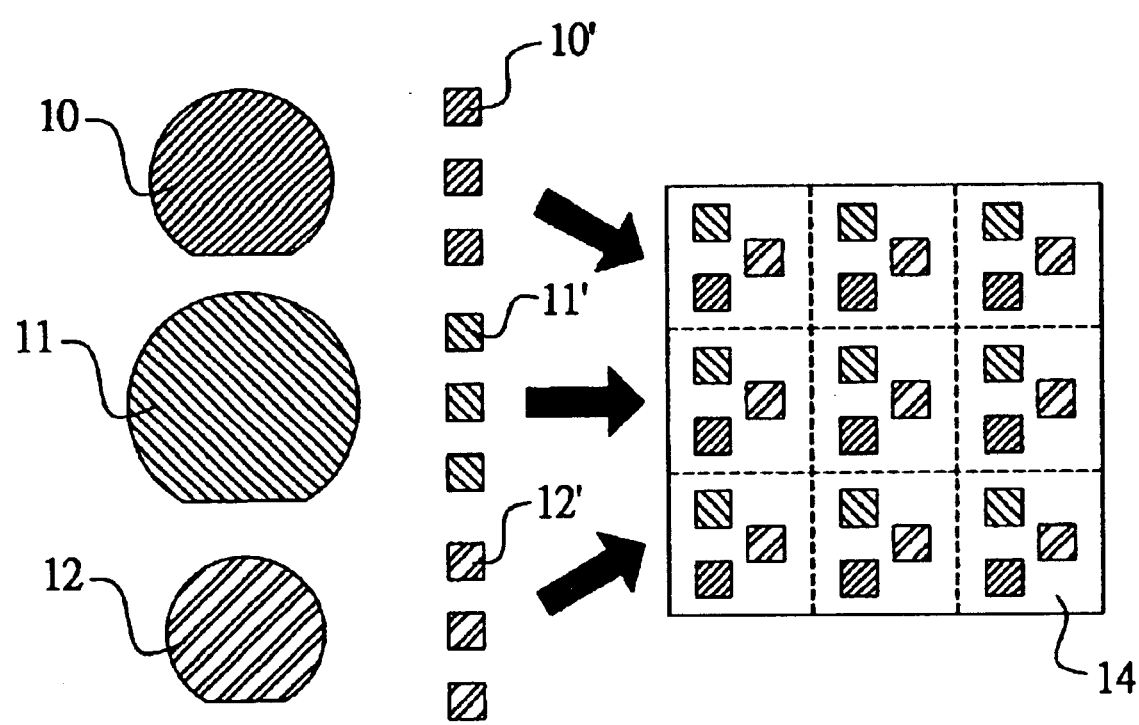
FIG. 1 is a schematically plan view of a conventional multichip package.
Figure 2:
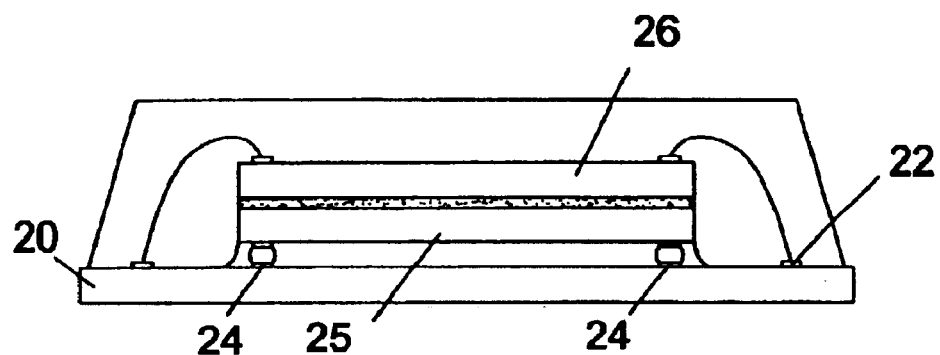
FIG. 2 is a schematically cross-sectional view of a conventional chip-stacked package.
Figure 3:
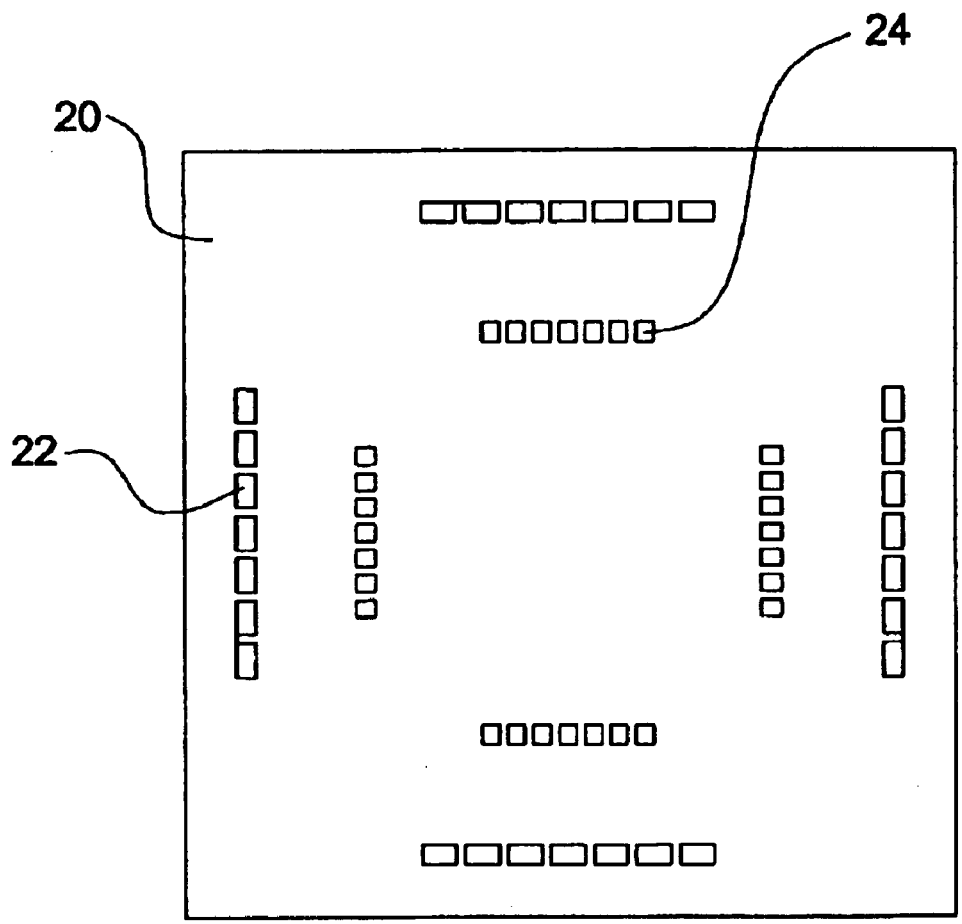
FIG. 3 is a plan view of a substrate for the conventional chip-stacked device of FIG.2.
Figure 4:
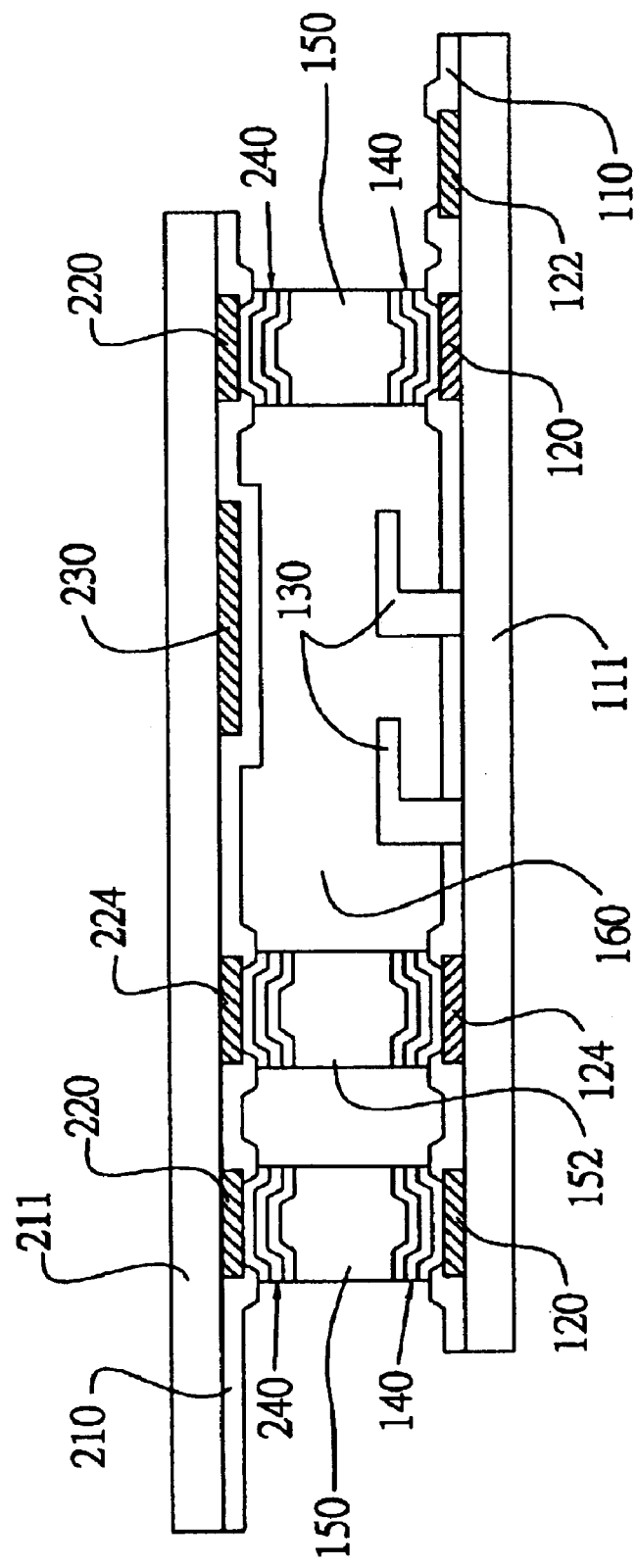
FIG. 4 is a schematically cross-sectional view of a multichip wafer-level package according to a first embodiment of the present invention.

FIG. 4 is a cross-sectional view of a multichip package 400 according to a first embodiment of the present invention. The package 400 comprises a base chip 111, a gold bump ring 150, a plurality of flip-chip bonding 152, and a cover chip 211. The base chip 111 has a semiconductor micro device 130 electrically connected to a plurality of external bonding pads 122 and internal bonding pads 124; a bonding ring 120; and a passivation layer 110 covering the respective top edge portions of the bonding ring 120, the external bonding pads 122, and the internal bonding pads 124 wherein the respective center portions of the bonding ring 120, the external bonding pads 122, and the internal bonding pads 124 are exposed from the passivation layer 110. An under bump metallurgy (UBM) 140 is disposed on the bonding ring 120 at a portion exposed from the passivation layer 110 wherein the UBM 140 comprises an adhesion layer, a barrier layer, and a wetting layer.

The cover chip 211 has a plurality of bonding pads 224, a bonding ring 220, and an electronic device 230 electrically connected to the bonding pads 224. The electronic device 230 can be an integrated circuit or any forms of passive devices. The bonding ring 220 is corresponding to the bonding ring 120 of the base chip 111, and the plurality of bonding pads 224 are corresponding to the internal bonding pads 124. The gold bump ring 150 is formed on the bonding ring 120 and adjacent to the UBM 140 for connecting the base chip 111 and the cover chip 211 so as to form a hermetical cavity 160 to enclose the semiconductor micro device 130. The internal bonding pads 124 of the base chip 111 and plurality of bonding pads 224 of the cover chip 211 are electrically connected together by the plurality of flip-chip bumps 152 such that the semiconductor micro device 130 can electrically connect to the electronic device 230. The cover chip 211 also provides a passivation layer 210 and a UBM 240, and the UBM 240 is employed for improving the electrical and mechanical connection between the gold bump ring 150 and the bonding ring 220 of the cover chip 211.

The external bonding pads 122 of the base chip 111 are disposed outside the bonding ring 120, and those skilled in the art will appreciate that the bonding pads 122 can electrically connect to an external substrate or a printed circuit board (PCB) by bonding wire, solder bump, or other conventional conductive structures thereby the devices on the base chip 111 and the cover chip 211 can electrically connect to the external circuit through the bonding pads 122.

Those skilled in the art will appreciate that the base chip 111 and the cover chip 211 are typically made of single crystal silicon. However, the base chip 111 and the cover chip 211 also can be made of a higher-resistiveness material such as glass, ceramic, bismaleimide-triazine, or fiberglass reinforced epoxy resin. Preferably, the base chip 111 and the cover chip 211 are made of same material (i.e. silicon) so as to avoid the thermal expansion mismatch problem, and the subsequent processes of the wafer-level package, therefore, can be implemented by the same processing methods and conditions for general silicon wafers.

The semiconductor micro device 130 disposed on the base chip 111 can comprise any micro active devices such as integrated circuits, MEM devices, or moving parts, or any micro passive devices such as sensors, capacitors, resistors, or inductors. However, those skilled in the art will appreciate that there is an insulating layer (passivation layer) between the wires and the bonding ring 120 such that a short circuit can be prevented. Also, since the package 400 has the hermetical cavity 160, a moving part of the semiconductor micro device 130 can be substantially moved within the hermetical cavity.

The FIG. 5 to FIG. 8 illustrate a manufacturing method of a multichip wafer-level package according to the present invention. Hereinwith, like elements in different figures will be indicated with like reference number.

Figure 5:
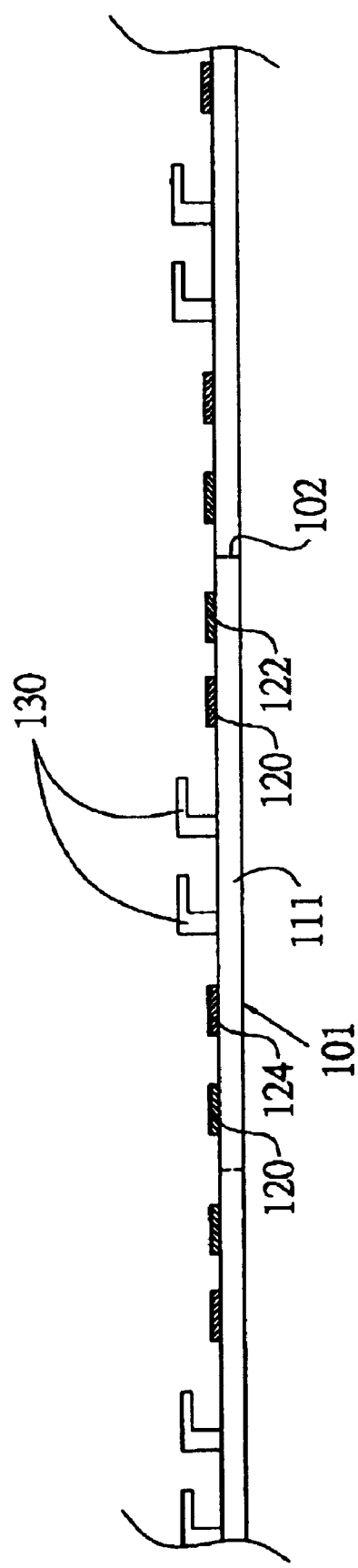
FIGS. 5–8 are schematic views for illustrating a manufacturing method of the multichip wafer-level package according to the first embodiment of the present invention.
Figure 6B:
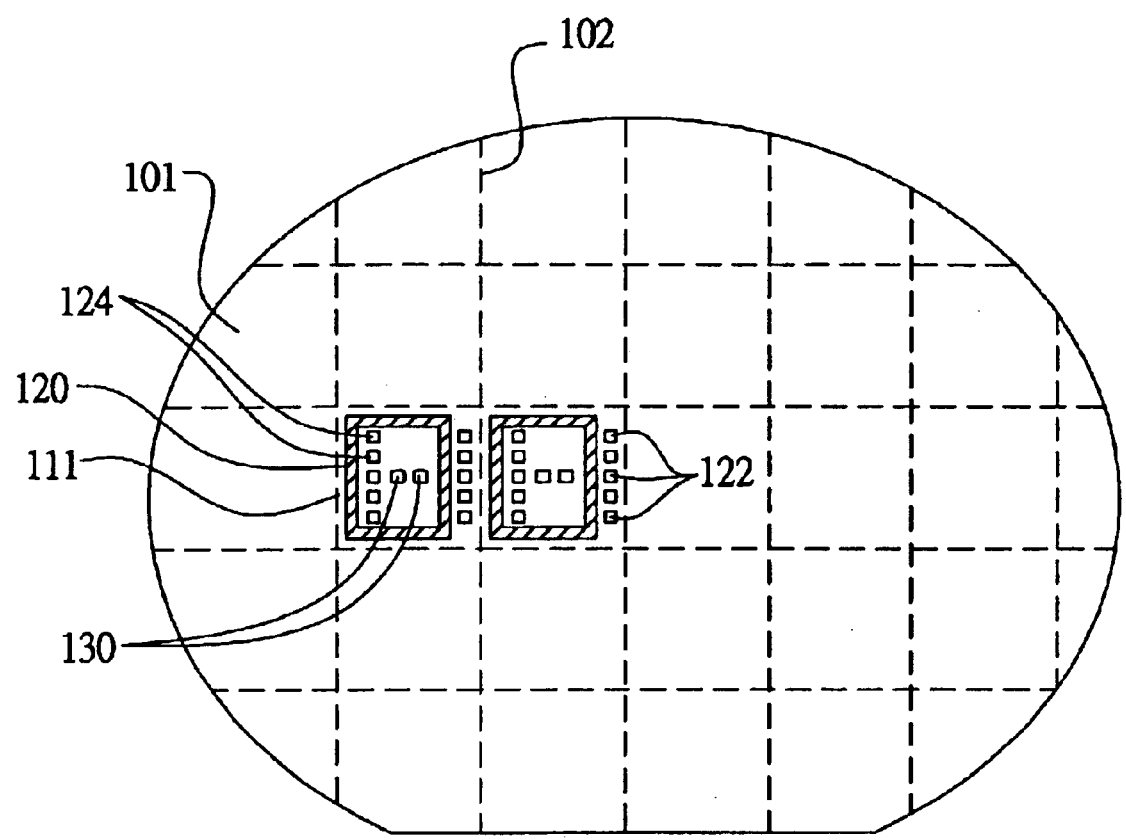

As shown in FIG. 5, a base wafer 101 comprises a plurality of base chips 111 spaced to one another by scribe lines 102, shown as dotted lines in FIG. 5, and the scribe lines 102 are generally located on the upper surface of the base wafer 101 as 'shown in FIG. 6b. A bonding ring 120 is disposed on the base wafer 101; a plurality of external bonding pads 122 are disposed outside the bonding ring 120, and a plurality of internal bonding pads 124 are disposed inside the bonding ring 120.

The processing steps of the bonding ring 120 and the bonding pads 122 are as follows: depositing an adhesion layer (not shown) on the base wafer 10; depositing a conductive-material layer on the adhesion layer by sputtering or evaporation; transferring patterns by a photolithography process; and etching undesired portions of the conductive-material layer. Alternatively, the processing steps can be also as follows: depositing an adhesion layer and a conductive material by a photolithography process; and stripping the photoresist so as to form the bonding ring 120, the external bonding pads 122, and the internal bonding pads 124 on the base wafer 101. The material of the conventional bonding ring, internal bonding pads, and external bonding pads is aluminum.

The number of the external bonding pads 122 and the internal bonding pads 124 depends on the number of the outputs and inputs of a designed circuit on each base chip 111. A passivation layer 110 formed by a dielectric layer covers the respective top edges portions of the bonding ring 120, the bonding pads 122, and the bonding pads 124 wherein the respective center portions of the bonding ring 120, the bonding pads 122, and the bonding pads 124 are exposed from the passivation layer 110. The passivation layer 110 can be formed of a polymide layer, a silica layer, a silicon nitride layer, or other well-known passivation materials.

FIGS. 6a and 6b show wafer bump process comprising a UBM process and a gold bump process wherein the UBM process can be found in U.S. patent application Ser. No. 09/928,694 (counterpart application of R.O.C Patent Application No. 90,109,841) commonly assigned to the present assignee, which is incorporated herein by reference. For example, the UBM 140 comprises an aluminum layer 140a, as an adhesion layer, formed on the bonding ring 120 at a portion exposed from the passivation layer 110; a nickel vanadium layer 140b, as a barrier layer, formed on the aluminum layer 140a; and a gold layer 140c, as a wetting layer, formed on the nickel vanadium layer 140b. According to the UBM 140 of the present invention, the aluminum layer 140a is selected as the adhesion layer since it provides a good adhesion for bonding ring 120 and the passivation layer 110. The gold layer 140c is selected as the wetting layer since it provides a good bonding effect to the gold bump ring 150.

The UBM 140 described above may be formed by an additive process for selective depositing composite layer thereof onto the aluminum bonding ring 120. Additive processes are well known and include lift-off techniques, and the use of shadow masks.

Alternatively, the UBM 140 described above may be formed by a subtractive process. The process comprises the following steps: (a) Sputter depositing UBM layers 140 (including adhesion layer 140a, barrier layer 140b and wetting layer 140c) across the passivation layer 110 and the exposed surface portions of the aluminum bonding ring 120; (b) Applying photoresist and patterning; (c) Electrodepositing gold material on the resist opening section; and (d) Etching the UBM layers with the gold material as shadow mask. Then, the photoresist is stripped so as to form the gold bump ring 150 and the internal bonding pads, which generally comprise at least about 90 weight percentage of gold (Au), as shown in FIG. 6a.

FIG. 6b shows a base wafer 101 comprising a plurality of base chips 111 wherein each base chip 111 is spaced to one another by scribe lines 102 and has the semiconductor micro device 130, the bonding ring 120, the internal bonding pads 124, and the external bonding pads 122.

Figure 7:
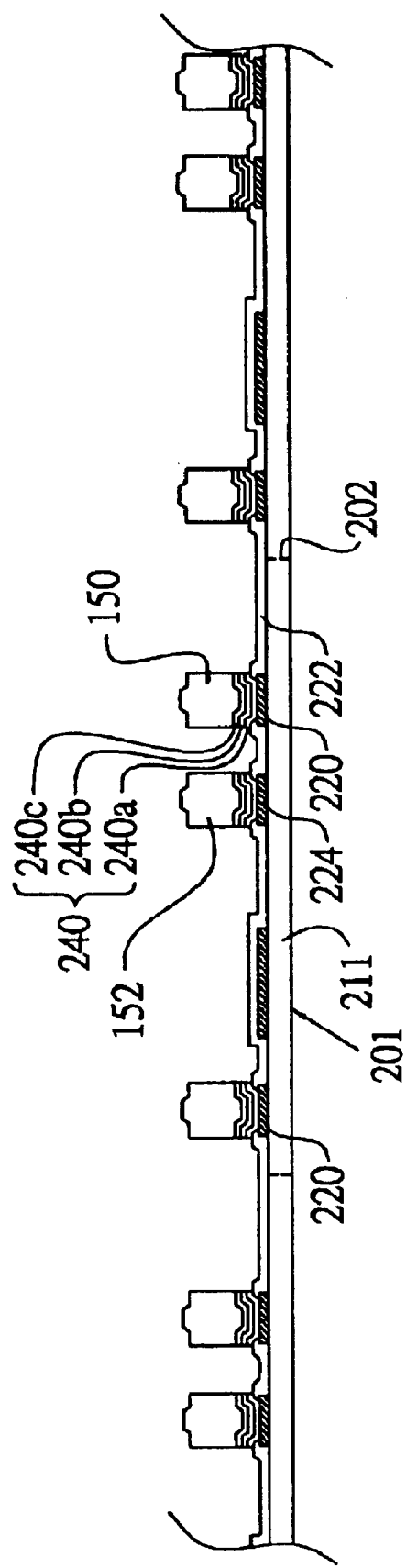

FIG. 7 discloses that of UBMs 240 are formed on the bonding ring 220 and the bonding pads 224 of a cover wafer 201 by a UBM process; and each UBM 240 comprises the adhesion layer 240a, the barrier layer 240b, and the wetting layer 240c. Then, the gold bump ring 150 and the plurality of flip-chip bumps 152 are respectively formed on the UBMs 240 of the bonding ring 220 and the bonding pads 224.

Figure 8:
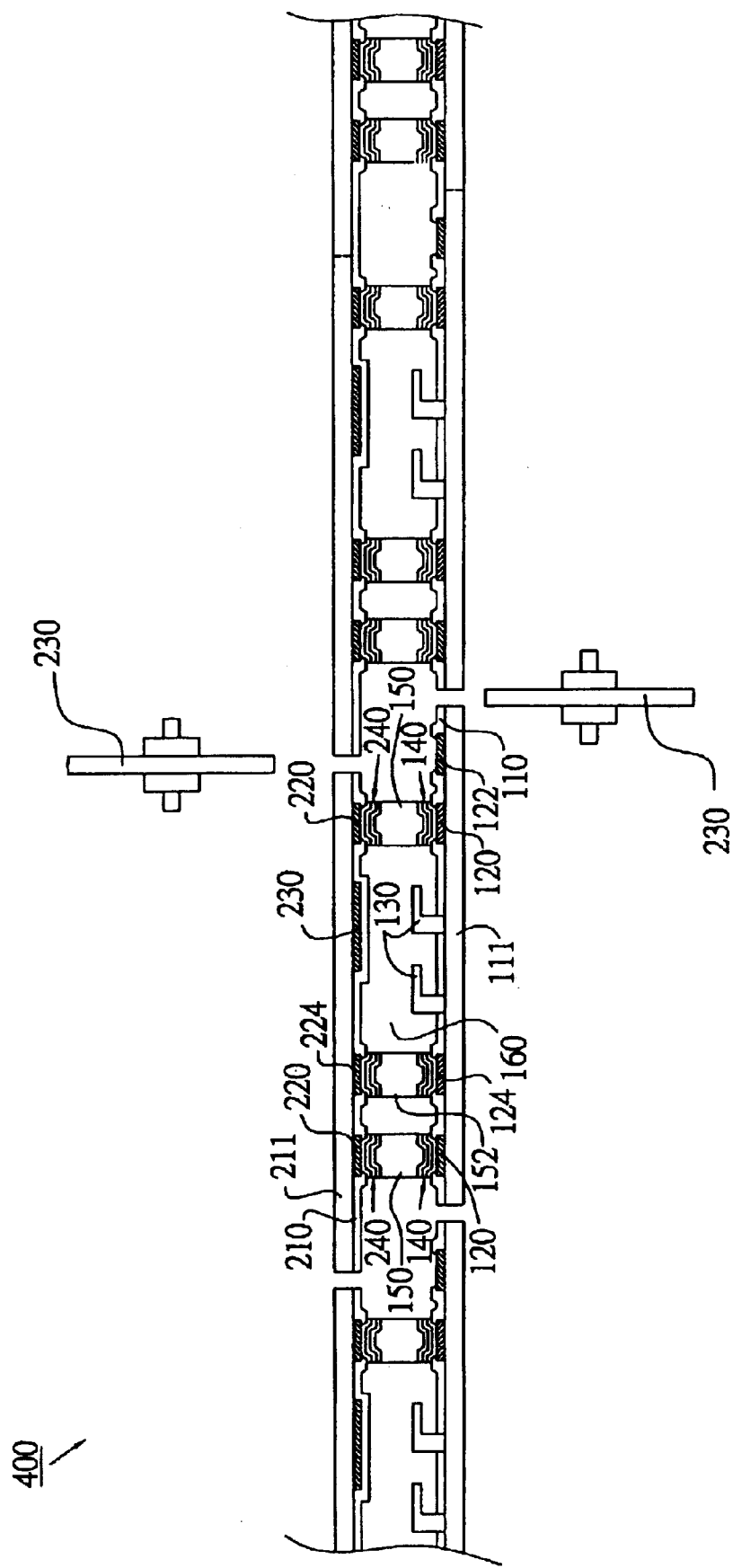

FIG. 8 shows a wafer-to-wafer bonding process in which the cover wafer 201 is aligned with the base wafer 101 such that the bonding ring 120 and the internal bonding pads 124 of the base chip 111 are respectively aligned with the bonding ring 220 and the external bonding pads 224 of the cover chip 211, and then the base wafer 101 and the cover wafer 201 are bonded together by a thermo-compression bonding process or a thermosonic bonding process so as to form a bonding wafer 900.

The thermosonic bonding process comprises the following steps: positioning one of the base wafer 101 and the cover wafer 201 to a hot stage with temperature between 100° C. and 150° C.; aligning the other wafer with the wafer on the hot stage and applying a pressure on it so as to initiate a contact between these two wafers; inputting an ultrasonic wave with a frequency ranging from 20 to 60 kHz and with an amplitude ranging from 20 to 200 mm while the pressure reaching a certain level, thereby the cold welding effect is generated, by the vibration and the pressure of the ultrasonic wave, so as to complete the bonding process. The input ultrasonic wave can erase the oxidative layer and contamination on the bonding pad surface and combine the heat so as to improve the bonding between wafers.

Finally, the thermosonic bonding process further comprises the step: cutting the bonding wafer 900 along the scribe lines 102 and the scribe lines 202 by a cutter 231 so as to form the packages 400 individually. During the cutting process, the cutter 231 cuts a partial thickness of the scribe lines 102 and the scribe lines 202, and then the packages 400 are split individually by a mechanical process thereby the packages 400 of the bonding wafer 900 can be prevented from being damaged by the extremely cutting of the cutter 231.

According to the method for manufacturing package of the first embodiment of the present invention, these two wafers can be bonded by employing the gold bump in vacuum with a low temperature (below 150° C.), namely cold welding process, such that the method is applicable for a packaging process having various type of semiconductor micro devices. Further, a metal (gold) with hardness, instead of the conventional outgasing material (i.e. epoxy), can be used as an intermediated layer between these two wafers for forming a hermetical cavity between these two wafers, so as to ensure the reliability of the semiconductor micro device.

Figure 9:
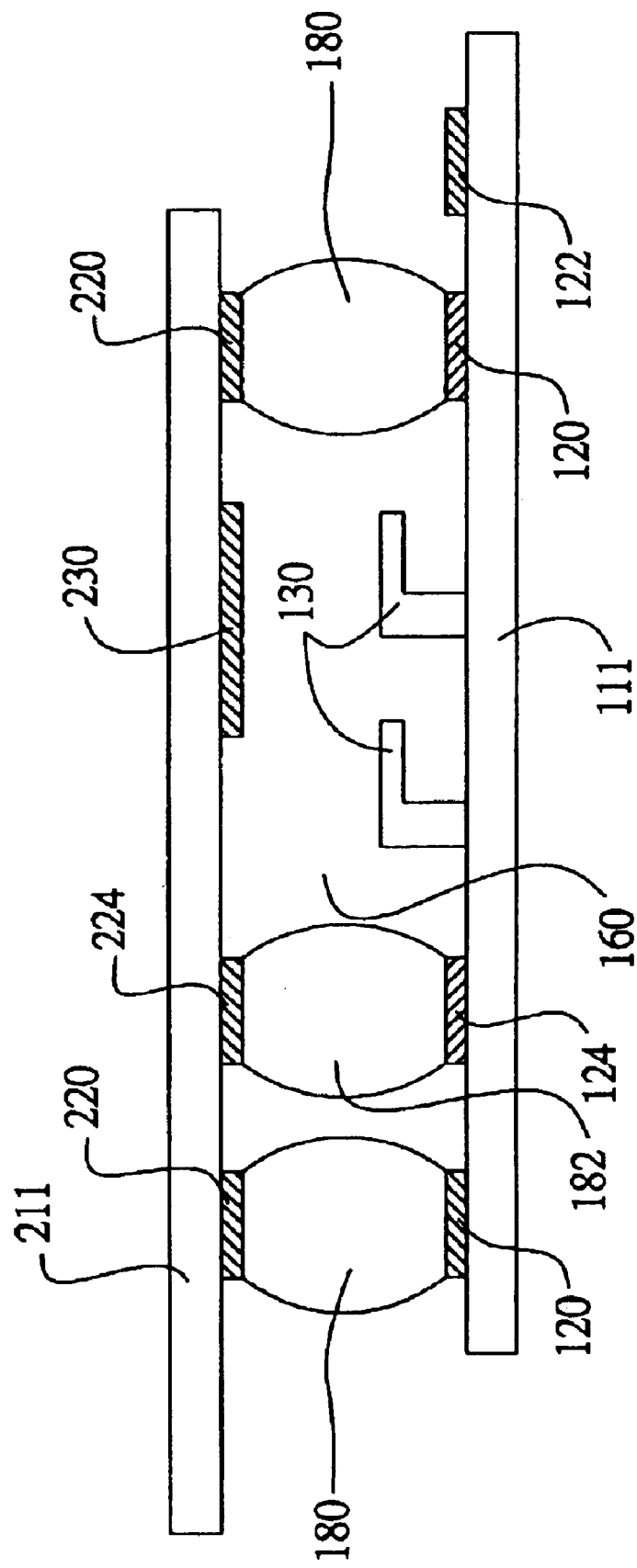
FIG. 9 is a schematically cross-sectional view of a multichip wafer-level package according to a second embodiment of the present invention.

FIG. 9 shows a schematically cross-sectional view of a multichip package 500 according to a second embodiment of the present invention. The package 500 is substantially similar to the package 400 of the first embodiment, and the difference between the package 400 and the package 500 is that the intermediated materials between the base chip 111 and the cover chip 211 are substituted by a bump ring 180 and conductive bumps 182. The conductive bumps 182 can be formed of solder and conductive glue (i.e. anisotropic conductive adhesive film; ACF) for electrically connecting the internal bonding pads 124 of the base chip 111 and the bonding pads 224 of the cover chip 211. The solder material can be a high melting point solder alloy (i.e. 5Sn/95Pb or 3Sn/97Pb), or a lower melting point solder alloy (i.e. 63Sn/37Pb or 40Sn/60Pb).

Figure 10:
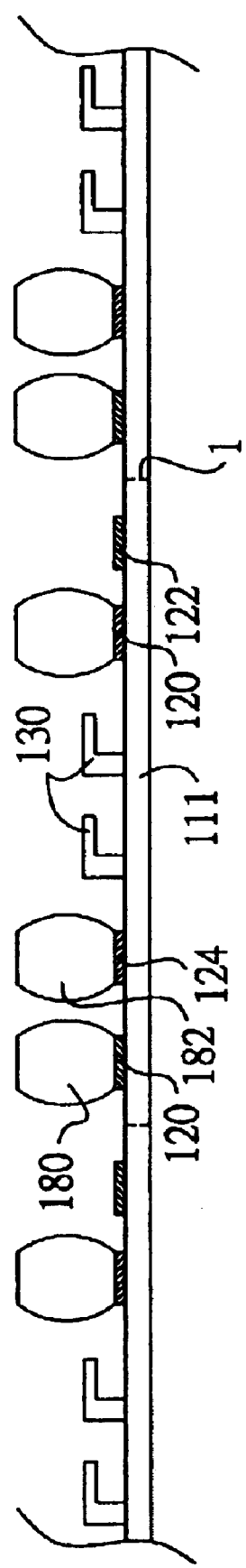
FIGS. 10–11 are schematic views for illustrating a manufacturing method of the multichip wafer-level package according to the second embodiment of the present invention.
Figure 11:
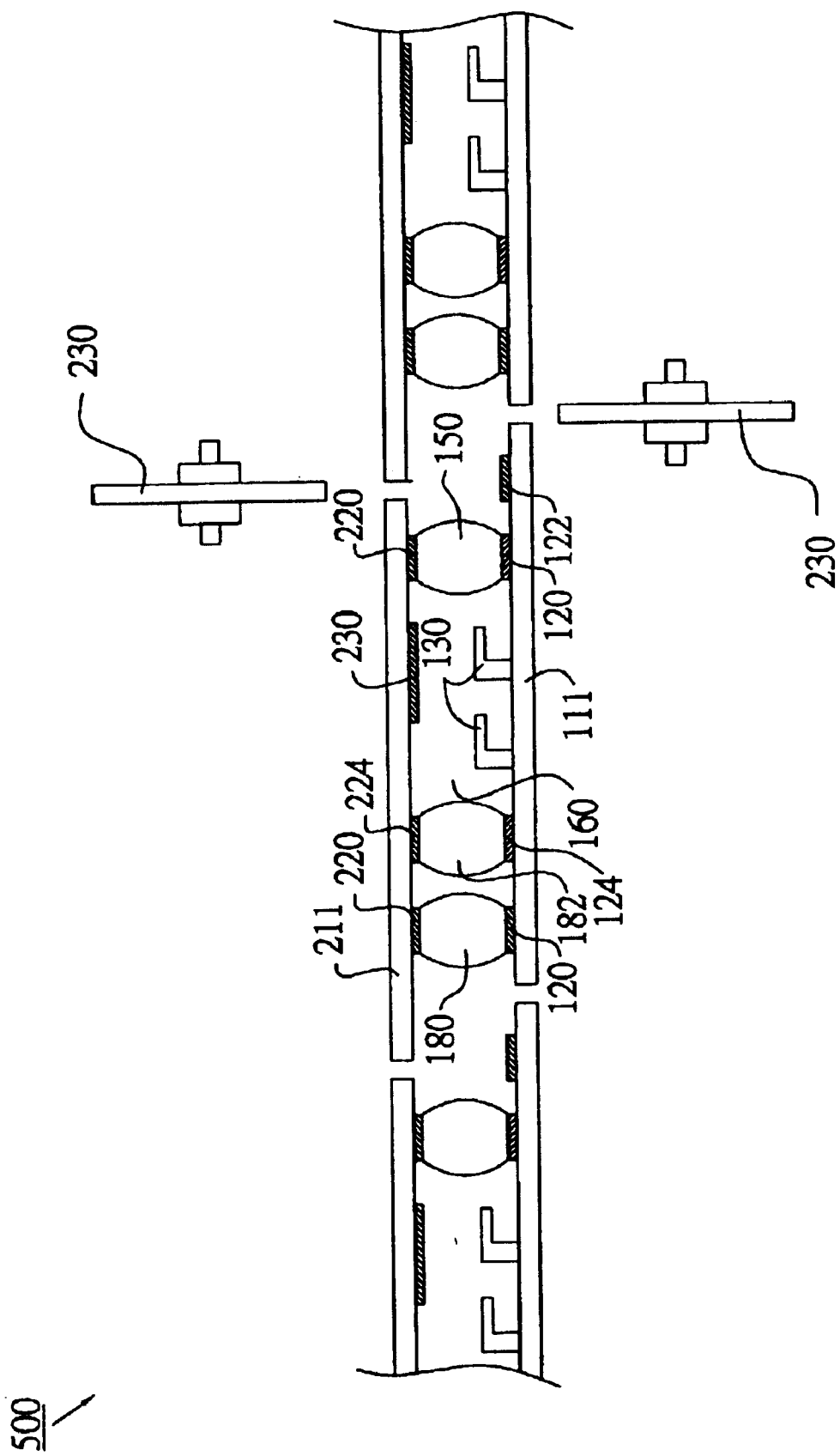

As shown in FIG. 10, if the bump ring 180 and the bumps 182 of the package 500 are the ACF, the ACF can be directly printed on the bonding ring 120 and the internal bonding pads 124 of the base wafer 101 without the UBM process. Then, the base wafer 101 and the cover wafer 201 are aligned with each other and begin the thermocompression bonding process such that the bump ring 180 and the bumps 182 of the base wafer 101 are electrically connected to the bonding ring 220 and the bonding pads 224 of the cover chip 201 so as to form a bonding wafer 950 as shown in FIG. 11; and a plurality of cavities are, therefore, formed between the base wafer 101 and the cover wafer 102. Finally, the bonding wafer 950 is cut so as to form the packages 500 individually.

While the foregoing description and drawings represent the embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components. The presently disclosed embodiments are therefore to be considered in all respects as illustrative and not restrictive, the scope of the invention being indicated by the appended claims and their legal equivalents, and not limited to the foregoing description.

What is claimed is:

1. A multichip wafer-level package, comprising:
    a first chip having a semiconductor device, a first bonding ring surrounding the semiconductor device, a plurality of internal bonding pads disposed within the first bonding ring and electrically connected to the semiconductor device, and a plurality of external bonding pads disposed outside the first bonding ring and electrically connected to the semiconductor device for electrically connecting to an external circuit;
    a second chip having an electronic device, a plurality of bonding pads electrically connected to the electronic device and corresponding to the internal bonding pads of the first chip, and a second bonding ring corresponding to the first bonding ring of the first chip;
    a bump ring disposed between the first bonding ring of the first chip and the second bonding ring of the second chip for bonding the first and the second chips so as to form a hermetical cavity for accommodating the semiconductor device; and
    a plurality of bumps electrically connecting the internal bonding pads of the first chip to the bonding pads of the second chip.

2. The multichip wafer-level package according to claim 1, wherein the first bonding ring of the first chip and the second bonding ring of the second chip are aluminum bonding rings.

3. The multichip wafer-level package according to claim 1, wherein the bump ring and the bumps are solders.

4. The multichip wafer-level package according to claim 1, wherein the respective bonding rings of the first chip and the second chip further have an under bump metallurgy (UBM).

5. The multichip wafer-level package according to claim 1, wherein the bump ring is a gold bump ring.

6. The multichip wafer-level package according to claim 1, wherein the material of the first chip and the second chip is silicon.

7. The multichip wafer-level package according to claim 1, wherein the electronic device is an integrated circuit.

8. The multichip wafer-level package according to claim 1, wherein the bump ring and the bumps are anisotropic conductive adhesive film (ACF).

9. The multichip wafer-level package according to claim 1, wherein the semiconductor device is selected from the group consisting of integrated circuit, micro-electro mechanical system (MEMs) component, moving part, and sensor.

10. A multichip wafer-level package, comprising:
    a first chip having a semiconductor device, a first bonding ring surrounding the semiconductor device, a plurality of internal bonding pads disposed within the first bonding ring and electrically connected to the semiconductor device, and a plurality of external bonding pads disposed outside the first bonding ring and electrically connected to the semiconductor device for electrically connecting to an external circuit;
    a second chip having an electronic device, a plurality of bonding pads electrically connected to the electronic device and corresponding to the internal bonding pads of the first chip, and a second bonding ring corresponding to the first bonding ring of the first chip;
    a bump ring disposed between the first bonding ring of the first chip and the second bonding ring of the second chip for bonding the first and the second chips so as to form a cavity for accommodating the semiconductor device; and
    a plurality of bumps electrically connecting the internal bonding pads of the first chip to the bonding pads of the second chip;
    wherein the bump ring and the bumps are anisotropic conductive adhesive film (ACF).

11. A multichip wafer-level package, comprising:
    a first chip having a semiconductor device, a first bonding ring surrounding the semiconductor device, a plurality of internal bonding pads disposed within the first bonding ring and electrically connected to the semiconductor device, and a plurality of external bonding pads disposed outside the first bonding ring and electrically connected to the semiconductor device for electrically connecting to an external circuit;
    a second chip having an electronic device, a plurality of bonding pads electrically connected to the electronic device and corresponding to the internal bonding pads of the first chip, and a second bonding ring corresponding to the first bonding ring of the first chip;
    a bump ring disposed between the first bonding ring of the first chip and the second bonding ring of the second chip for bonding the first and the second chips so as to form a cavity for accommodating the semiconductor device; and
    a plurality of bumps electrically connecting the internal bonding pads of the first chip to the bonding pads of the second chip;
    wherein the semiconductor device is selected from the group consisting of integrated circuit, micro-electro mechanical system (MEMs) component, moving part, and sensor.

* * * * *